United States Patent [19]

Matsuzaki et al.

[11] Patent Number: 4,994,895
[45] Date of Patent: Feb. 19, 1991

[54] HYBRID INTEGRATED CIRCUIT PACKAGE STRUCTURE

[75] Inventors: Toshio Matsuzaki, Yokohama; Hiroaki Toshima, Tokyo, both of Japan

[73] Assignee: Fujitsu Limited, Kawasaki, Japan

[21] Appl. No.: 375,708

[22] Filed: Jul. 5, 1989

[30] Foreign Application Priority Data

Jul. 11, 1988 [JP] Japan ............... 63-172433
Jan. 10, 1989 [JP] Japan ............... 1-003318
Jan. 19, 1989 [JP] Japan ............... 1-012605
May 9, 1989 [JP] Japan ............... 1-117126

[51] Int. Cl.$^5$ ............ H01L 23/48; H01L 23/28
[52] U.S. Cl. ............................ 357/72; 357/70; 357/81; 357/68
[58] Field of Search ............ 357/70, 72, 68, 74, 357/81

[56] References Cited

U.S. PATENT DOCUMENTS 4,816,427 3/1989 Dennis ............................ 357/68

FOREIGN PATENT DOCUMENTS 13874 2/1978 Japan ............................ 437/209
103752 8/1980 Japan ............................ 357/70
39558 3/1982 Japan ............................ 357/72
18948 2/1983 Japan ............................ 357/70
99360 5/1985 Japan .
102054 5/1986 Japan .
263665 11/1987 Japan .

Primary Examiner—Andrew J. James
Assistant Examiner—Viet Q. Nguyen
Attorney, Agent, or Firm—Staas & Halsey

[57] ABSTRACT

A hybrid integrated circuit including: a circuit substrate on which at least one of an active and passive semiconductor element is formed; a lead frame having a plurality of leads and a support plate with an opening formed therein, and supporting the circuit substrate thereon; and a mold of resin for packaging the circuit substrate, support plate and part of the leads of the lead frame, wherein a bottom surface of the circuit substrate is exposed and made to contact the mold resin through the opening. The circuit has a ratio of the exposed bottom surface to the entire bottom surface greater than 50%, and a ratio of surface area of the circuit substrate to a principal surface area of the mold of greater than 60%. There are a plurality of support plate configurations. The circuit relieves the mechanical stress caused in the mold package and eliminates cracking of the mold. Further, a package structure can be made resistant to deformation by appropriately selecting mold thicknesses above and below the circuit substrate.

21 Claims, 15 Drawing Sheets

FIG. 6f
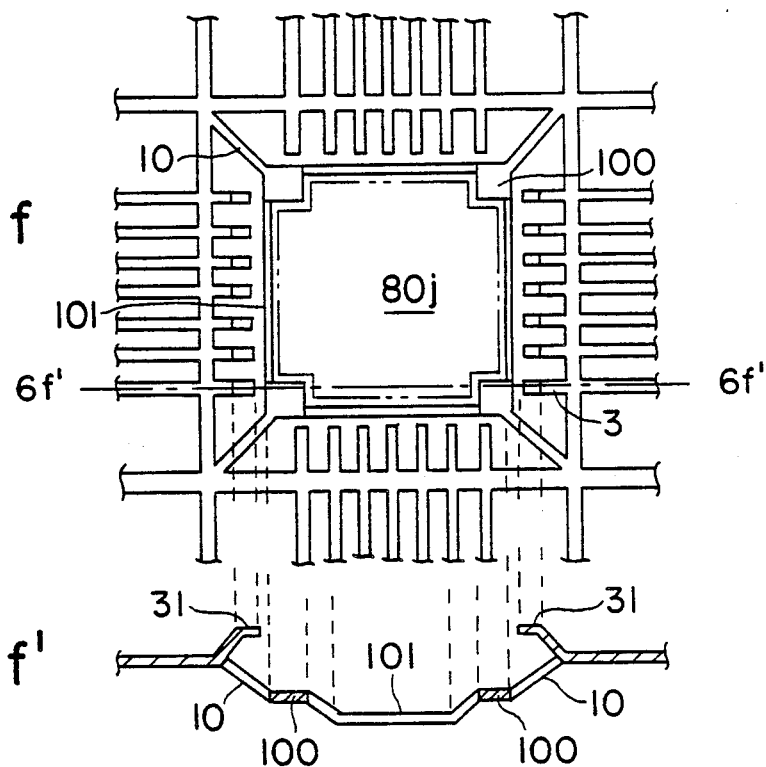
FIG. 6f'
FIG. 6g
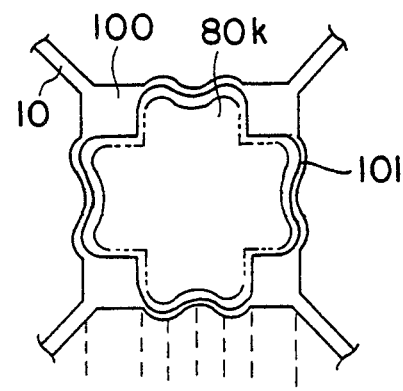
FIG. 6g'
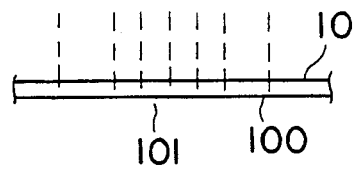

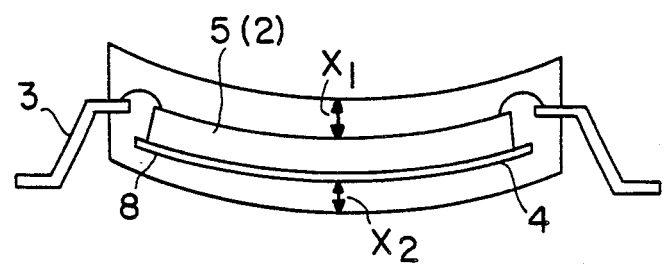
FIG. 13
FIG. 14a
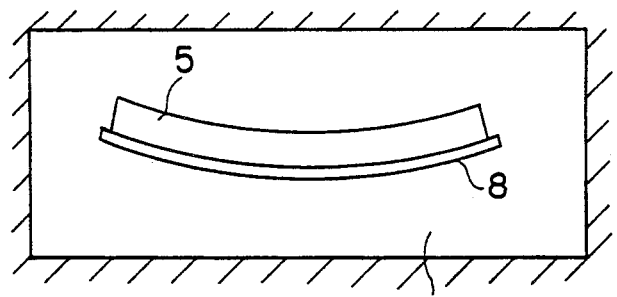
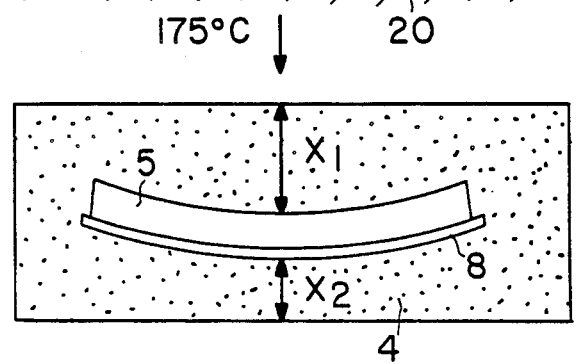
FIG. 14b

4,994,895

HYBRID INTEGRATED CIRCUIT PACKAGE STRUCTURE

BACKGROUND OF THE INVENTION

The present invention relates to an integrated circuit and, more particularly, to a hybrid integrated circuit, including both active and passive elements, and a novel package structure therefore. The present invention is intended to make a hybrid integrated circuit more resistant to the effects of repeated thermal expansion and contraction.

As a package structure for semiconductor integrated circuits or hybrid integrated circuits, an epoxy resin is widely used as a molding material, an insert-mold method is utilized which is suitable for mass production, and a circuit substrate and a lead frame are incorporated therein during the mold process.

FIGS. 1(a) and 1(b) show, respectively, a schematic cross section of a conventional hybrid integrated circuit and a plan view of a lead frame used therein. The lead frame 60 has a square support plate 61 centrally arranged, which sometimes is called a stage or tab. On the support plate 61 a circuit substrate 62 is mounted and is selectively connected to leads 63 by a wire bonding method. The above structure is finally molded as a package 64 using epoxy resin material. The circuit substrate 62 comprises a base member 66 made of, e.g., alumina ceramic, epoxy glass or silicon, and active and passive elements 67 disposed on the base member 66.

In such a package structure, differences in expansion coefficients, adhesion characteristics, etc. among the parts thereof can cause cracking problems in the mold package.

Usually, the expansion coefficient of the base member 66 is smaller than that of the molding material, and adhesive strength between the mold material and the support plate 61 of metal is lower than that of the mold material to the base member. When the hybrid integrated circuit (sometimes hereinafter called "device") is put into operation and subjected to repeated heat cycles of expansion and contraction, the lower portion of the mold package 64 cannot withstand the stress, which concentrates along a periphery of the support plate 61, and finally the mold package 64 of the device develops a crack 65 along a side or neighboring two sides of the square periphery of the support plate as shown in FIG. 1(a).

In order to relieve the stress on the support plate 61 due to an expansion difference relative to the mold material, it has been proposed in Japanese Unexamined Patent Publication No. SHO-52-95173 dated Aug. 10, 1977 by S. Kobayashi, to form the lead frame with an opening or void portion in the support plate. This publication discloses that the support plate of the lead frame is composed of a surrounding peripheral frame portion and either a single or a plurality of openings formed therein.

Another potential solution was disclosed in the Japanese Unexamined Patent Publication No. SHO-63-81966, dated Apr. 12, 1988 by H. Tsutani, et al. This publication discloses a device including a lead frame and a support plate having a plurality of cuts from the periphery toward the center of the support plate.

The above two disclosures are concerned with a semiconductor integrated circuit having a single monolithic semiconductor chip mounted on the support plate. Generally the semiconductor chip size (surface area) is small compared with the outline dimensions of the mold package. The hybrid integrated circuit including a circuit substrate and a plurality of active and passive elements mounted thereon is larger and tends toward higher integration, and thus the size of the circuit substrate occupies a substantial part of the mold package size. The stress generated in the mold package during operation, then, becomes a serious problem.

SUMMARY OF THE INVENTION

It is a general object of the invention, therefore, to provide a hybrid integrated circuit which is better suited to withstand repeated cycles of expansion and contraction.

It is a more specific object of the invention to provide a package structure of a hybrid integrated circuit, which is excellent in durability, even when the hybrid integrated circuit is largely integrated.

It is another object of the invention to provide a hybrid integrated circuit which can be fabricated by otherwise conventional methods.

It is still another object of the invention to provide a package structure for a hybrid integrated circuit with minimum deformation of the mold package between a premolding and post-molding states.

The above objects can be achieved by a hybrid integrated circuit including: a circuit substrate having a base member and at least one of a semiconductor active element and a passive element disposed on the base member; a lead frame having a plurality of leads and a support plate arranged at outward and inward portions thereof, respectively, each lead having an inner lead and an outer lead; a circuit substrate disposed on the support plate and selectively connected with an inside end of the inner leads; a mold of resin material packaging the circuit substrate, support plate and inner leads; and the support plate having an opening for exposing the bottom surface of the circuit substrate to the mold, and a ratio of the exposed bottom surface to an entire bottom surface thereof being greater than 50%. Further, a ratio of a surface area of the circuit substrate to a principal surface area of the mold package is greater than 60%.

According to the present invention, the molding material of epoxy resin contacts the bottom surface of the circuit substrate with a stronger adhesive force than when the mold material contacts directly the support plate of the prior art. And further, because the support plate area is remarkably reduced from the prior art, the stress due to thermal expansion of the support plate is also reduced and is further distributed over the entire surface thereof. These factors combined have an effect of avoiding the defect of package cracks.

In order to minimize a characteristic change to the active or passive elements of the hybrid integrated circuit between pre-molding and post-molding states, the present invention discloses that a relation between mold thickness above and below the circuit substrate should be chosen corresponding to the relation between expansion coefficients of the circuit substrate and the support plate.

During a molding process of the package, a preassembled hybrid integrated circuit is heated up to about 175° C. which causes a deformation thereof. The deformation remains after the molding process, which is the cause of the characteristic change. The deformation can be eliminated by the above package structure of the present invention.

Other objects and advantages of the present invention will become apparent from the detailed description to follow taken in conjunction with the appended claims.

BRIEF DESCRIPTION OF THE DRAWINGS

FIGS. 6(a) through 6(i) show top views of various configurations of the support plate in a lead frame according to the present invention, the support plate having a variety of opening shapes formed therein;

FIGS. 6(f') through 6(i') show cross sections of the lead frames of FIGS. 6(f) through 6(i), respectively, some including a circuit substrate;

FIG. 13 is a schematic cross section of the device illustrating deformation caused by a difference in expansion between the circuit substrate and support plate;

FIGS. 14(a) and 14(b) illustrate schematically two sequential steps in which the mold package is deformed when $x_1$ and $x_2$ are almost equal;

Throughout the drawings, the same reference numerals designate and identify the same or similar parts.

DETAILED DESCRIPTION OF THE PREFERRED EMBODIMENTS

Figure 1A:
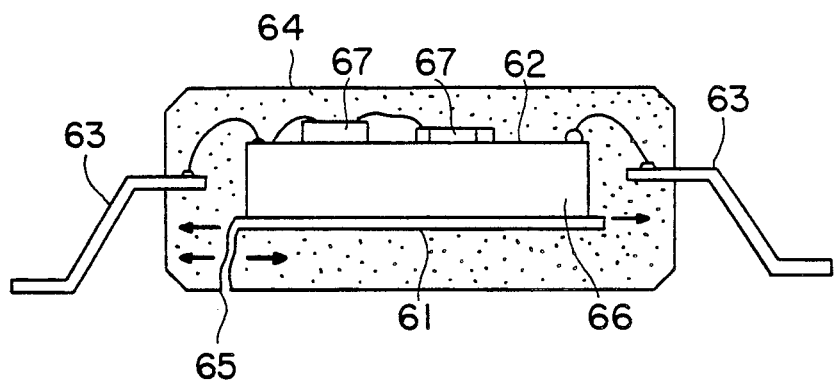
FIG. 1(a) is a schematic cross section of a hybrid integrated circuit of the prior art.
Figure 1B:
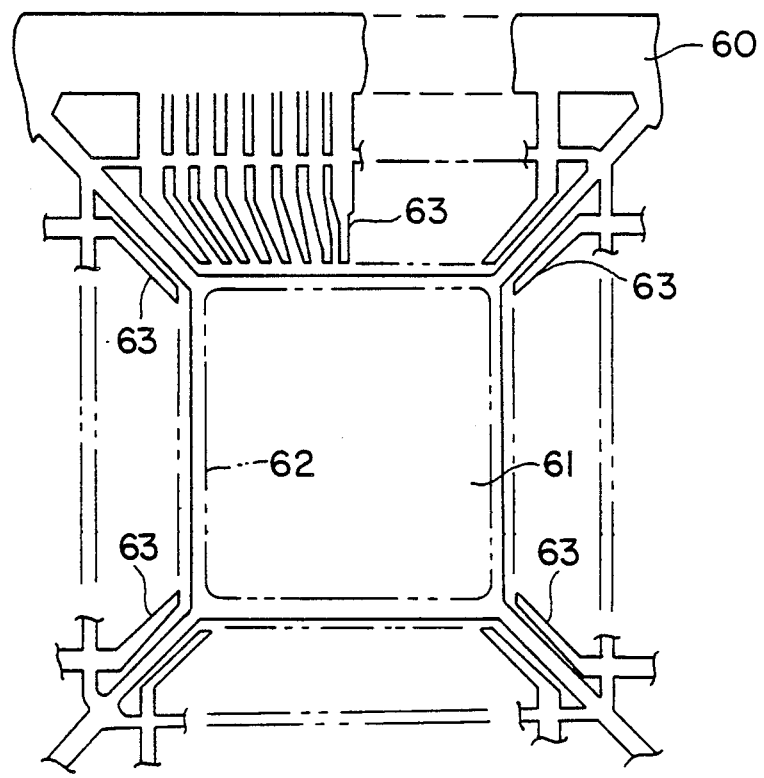
FIG. 1(b) is a plan View of a lead frame used in the device shown in FIG. 1(a), a support plate thereof having no opening.
Figure 2:
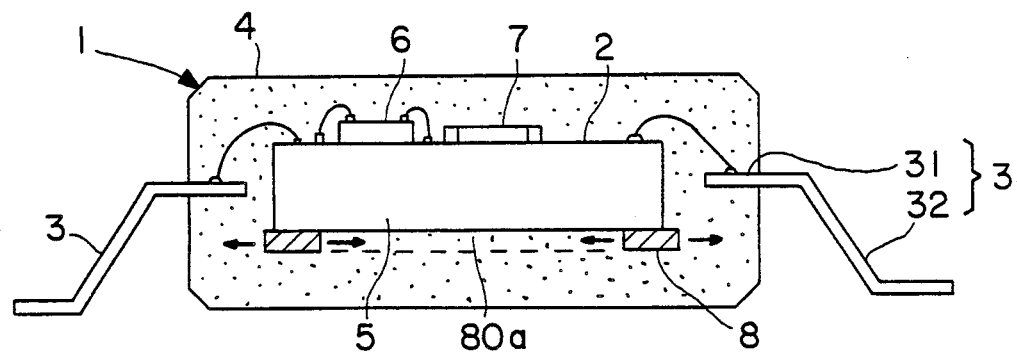
FIG. 2 is a schematic cross section of a hybrid integrated circuit of a first embodiment of the present invention.
Figure 3:
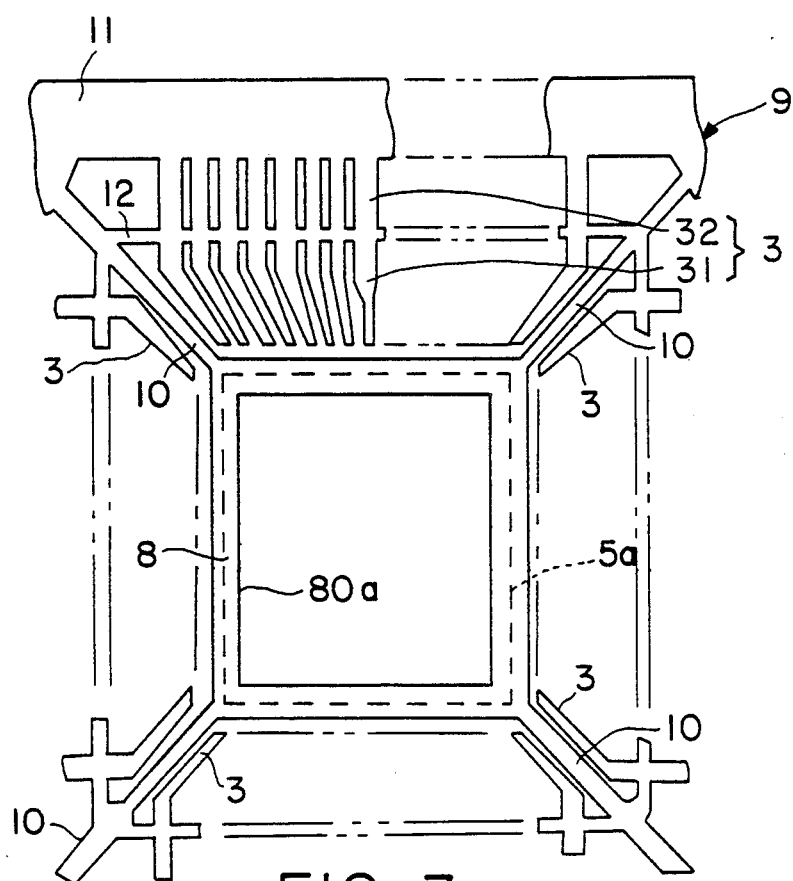
FIG. 3 is a plan view of a lead frame used in the first embodiment of the present invention, the lead frame having an opening in the support plate.

FIG. 2 is a cross section of a first embodiment of a hybrid integrated circuit 1 according to the present invention, and FIG. 3 is a top view of a lead frame 9 used in the first embodiment. The lead frame 9 is any of copper alloy, iron nickel alloy, etc. A circuit substrate 2 includes a base member 5 and chip parts mounted thereon. The base member 5 is of insulating material such as alumina ceramic, epoxy glass, glass coated metal, oxide covered silicon, sapphire, etc. The chip parts include active and/or passive elements, such as a semiconductor active element 6 forming an integrated circuit, a capacitor chip 7, etc. These chip parts are bonded on the base member 5 by a conductive bonding resin and a terminal thereof is selectively connected to a bonding pad on the base member 5 or connected mutually. The circuit substrate 2 is mounted on a support plate 8 and is fixed thereon by a heat resistive adhesive. A plurality of leads 3 of the lead frame 9 are arranged on each side of the circuit substrate 2. Each lead 3 includes an inner lead 31 and outer lead 32. An inside end of each inner lead 31 is connected selectively to the bonding pad on the base member 5. The whole structure except a substantial portion of the leads 3, is molded in a mold package 4 of epoxy resin, forming the completed hybrid integrated circuit 1 of the present invention.

In the first embodiment, the chip parts 6, 7 are used as the active and passive elements, however, the elements are not restricted to chip parts. Instead, thick or thin film parts (not shown in FIG. 2) forming a capacitor or resistor can be utilized, which are directly formed on the base member 5 by screen printing or sputtering methods.

The leads 3 and support plate 8 are an integral part of the lead frame 9, and the support plate 8 has an outline of a square shape having a square opening 80a therein. Therefore, the support plate 8 is composed of four side strips forming a square outline, and is connected to the by a support bar 10. The opening 80a has a predetermined size such that the remaining four sides of the support plate 8 have sufficient size to support the base member 5, but preferably the base member 5 does not go beyond the outside periphery of the support plate 8. Dimensions of the base member 5 are shown by dashed lines 5a in FIG. 3. The support plate 8 is centrally located in the lead frame 9, and the inside ends of the inner leads 31 are disposed close to the support plate 8 for easy connection by a wire bonding process to the bonding pad on the circuit substrate 2. An outside frame portion 11 and an interconnection bar 12 between leads 3 are removed after the molding process.

The opening 80a functions to make the resin material flow freely to the bottom surface of the circuit substrate 2 (base member 5) and adhere thereto during molding of the mold package 4 utilizing a transfer-mold method. The adhesive strength against shearing force between the epoxy resin of the mold package 4 and other parts, such as base member 5 and support plate 8 therein, is shown below in Table 1.

TABLE 1

| Part Name (material) | Adhesive strength against shearing force (Kg/mm$^2$) |
|---|---|
| Lead frame (copper alloy) | 0.2 |
| Semiconductor chip (silicon) | 5.0 |
| Base member (alumina) | 6.0 |
| Base member (epoxy glass) | 2.0 |

The functions of the opening 80a formed in the support plate 8 will now be explained. When the device 1 is heated, the mold package 4, circuit substrate 2, support plate 8, etc. are subjected to different expansion. The mold material of package 4 directly contacts the base member 5 through the opening 80a of the predetermined size. Therefore, as seen from Table 1, the adhesive strength of the mold package 4 to the base member 5 is much greater than using the prior art support plate without an opening. The lower portion of the package 4 under the base member 5 is fixed more rigidly thereto, and cannot easily move apart from the bottom surface of the base member 5.

Further, because the effective area of the support plate 8 of the embodiment is remarkably reduced, the stress due to expansion of the support plate is also reduced and further distributed to the overall fringe portions thereof, resulting in avoiding stress being concentrated at the outer fringe portion only. The above two factors contribute to eliminate cracking in the package 4.

Figure 4A:
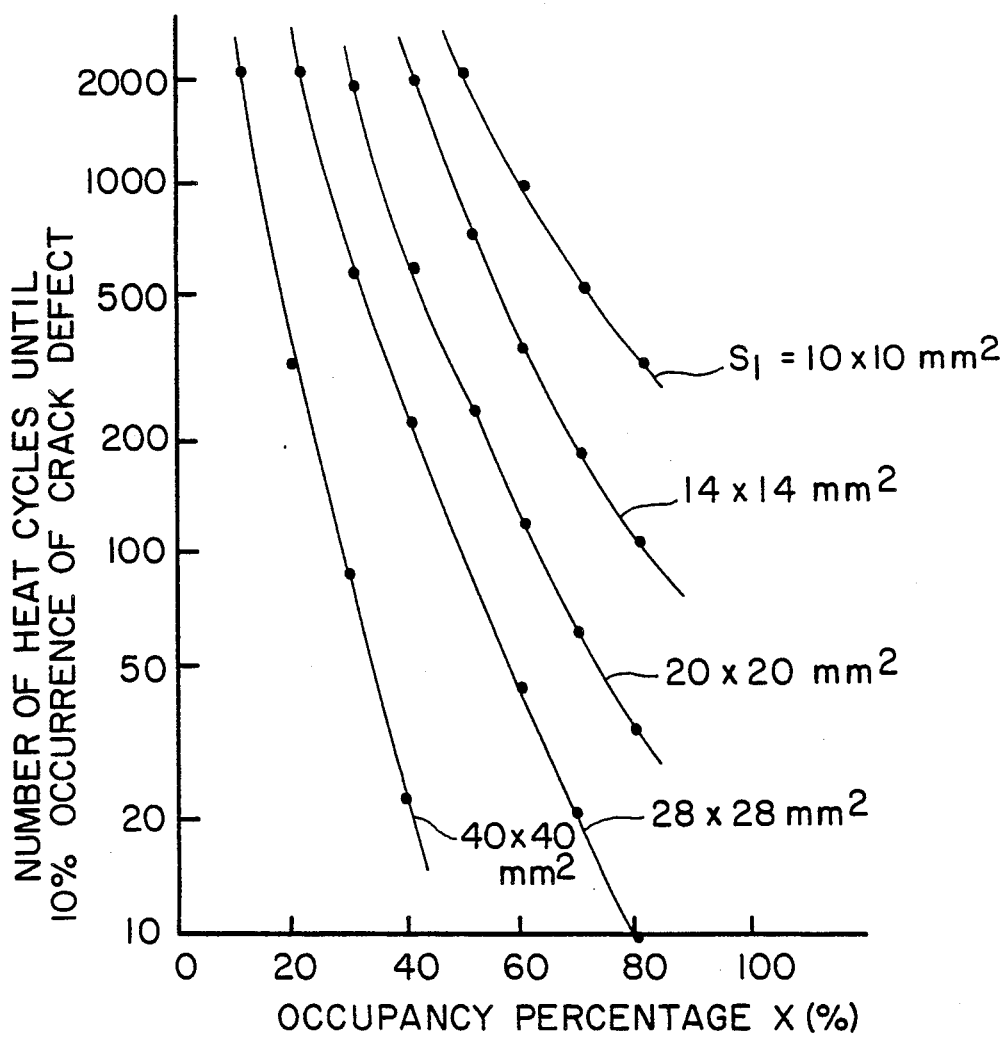
FIG. 4(a) is a graph illustrating the relation between occupancy percentage and crack occurrence tendency, where the occupancy percentage is given by a ratio of the surface area $S_0$ of the circuit substrate to that ($S_1$) of the mold package.

A crack occurrence probability will increase remarkably as the package size becomes larger when the support plate without an opening (the prior art type) is utilized. FIG. 4(a) shows data of a relation between an occupancy percentage X of the circuit substrate 2 and the crack occurrence tendency when a package size is changed. The occupancy percentage along the abscissa is defined by a ratio of surface area $S_0$ of the circuit substrate 2 (base member 5) to principal surface area $S_1$ of the mold package, and the crack occurrence tendency along the ordinate is indicated by a number of heat cycles until a 10% occurrence of crack defect is observed among test pieces. The occupancy percentage X is, therefore, expressed by a ratio $S_0/S_1$, and $S_0$ defining the surface area of circuit substrate 2 and $S_1$ the principal surface area of mold package are shown, respectively in FIG. 4 (b).

In order to perform the above tests, a large number of circuit substrates having a square shape and a thickness of 0.5 mm but having different occupancy percentages were prepared for five groups having different mold package sizes. And further, a large number of lead frames, having different sized support plates and a square shape without an opening, were prepared corresponding to each group of five package sizes. The occupancy percentage becomes 80% when both surface areas of the support plate and circuit substrate are equal.

Figure 4B:
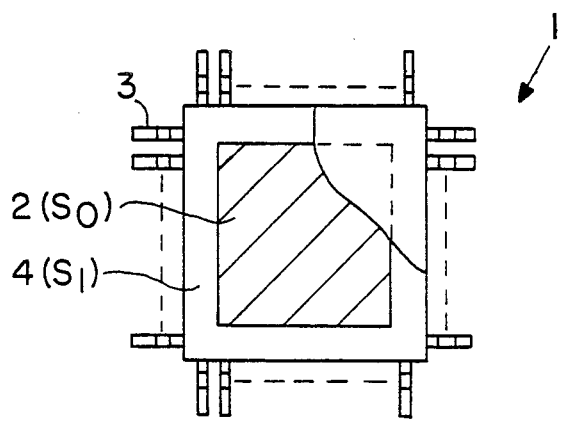
FIG. 4(b) is a schematic top view of the device with the package (partly cut away), in which $S_0$ and $S_1$ are indicated.

To fabricate test pieces, each of the circuit substrates was mounted on the square support plate of the lead frame and fixed thereto by adhesive. The test piece, having a 4 mm thickness of the mold package 4 as shown in FIG. 4(b), were obtained after molding in epoxy resin by a transfer-mold method. The different outline dimensions of the package were fabricated by changing the dimensions of the molding die. In this way, test pieces of five different package sizes, each group having different occupancy percentages, were prepared.

These test pieces were subjected to heat cycle tests including the steps of dipping in a solution of $-55°$ C. for five minutes and dipping in a solution of 125° C. for five minutes. A solution having the tradename "GALDEN D02TS" made by Montefluos S.p.A. of Italy, is used for both tests. The number of heat cycles was measured when 10% of the test pieces showed a package crack for each package size. The results are shown in FIG. 4(a).

In can be seen from the figure that, when either the package size or the occupancy percentage X becomes larger, the package is more liable to crack. Of the two, the probability of cracking is more serious when the package size grows larger. When X is larger than 60%, the package having the smallest size $10 \times 10$ mm$^2$ cannot withstand 1000 heat cycles, which is a criteria for judging whether the package can be used or not.

This is a serious problem for a hybrid integrated circuit having the circuit substrate with a large size and a high occupancy percentage X. Generally, a semiconductor integrated circuit including a single semiconductor chip has at most a surface area of about $15 \times 15$ mm$^2$, and the occupancy percentage X of the semiconductor chip to the package outlines is less than 50%, mostly less than 30%. Under these conditions the semiconductor chip is completely covered by epoxy resin and buried in the package, and there is very little chance of package crack, therefore, it is almost left out of consideration. When the occupancy percentage X is increased over 60%, the thickness of the package becomes comparatively thin and the mold package becomes very susceptible to cracks. When the package size is further increased above $20 \times 20$ mm$^2$, resistivity to cracking is further decreased, and finally it is almost impossible to obtain usable devices by using the square support plate 61 of the prior art.

A hybrid integrated circuit of the present invention enables an application of an occupancy percentage X of the circuit substrate in a range greater than 60% without package cracking, resulting in the package size being smaller and integration density being greater. According to the present invention, the support plate having an opening is utilized, and is explained as the first embodiment using FIGS. 2 and 3. In the embodiment, the opening 80a is formed in the support plate 8 to allow the resin material to flow to the bottom surface of the circuit substrate 2.

Figure 5:
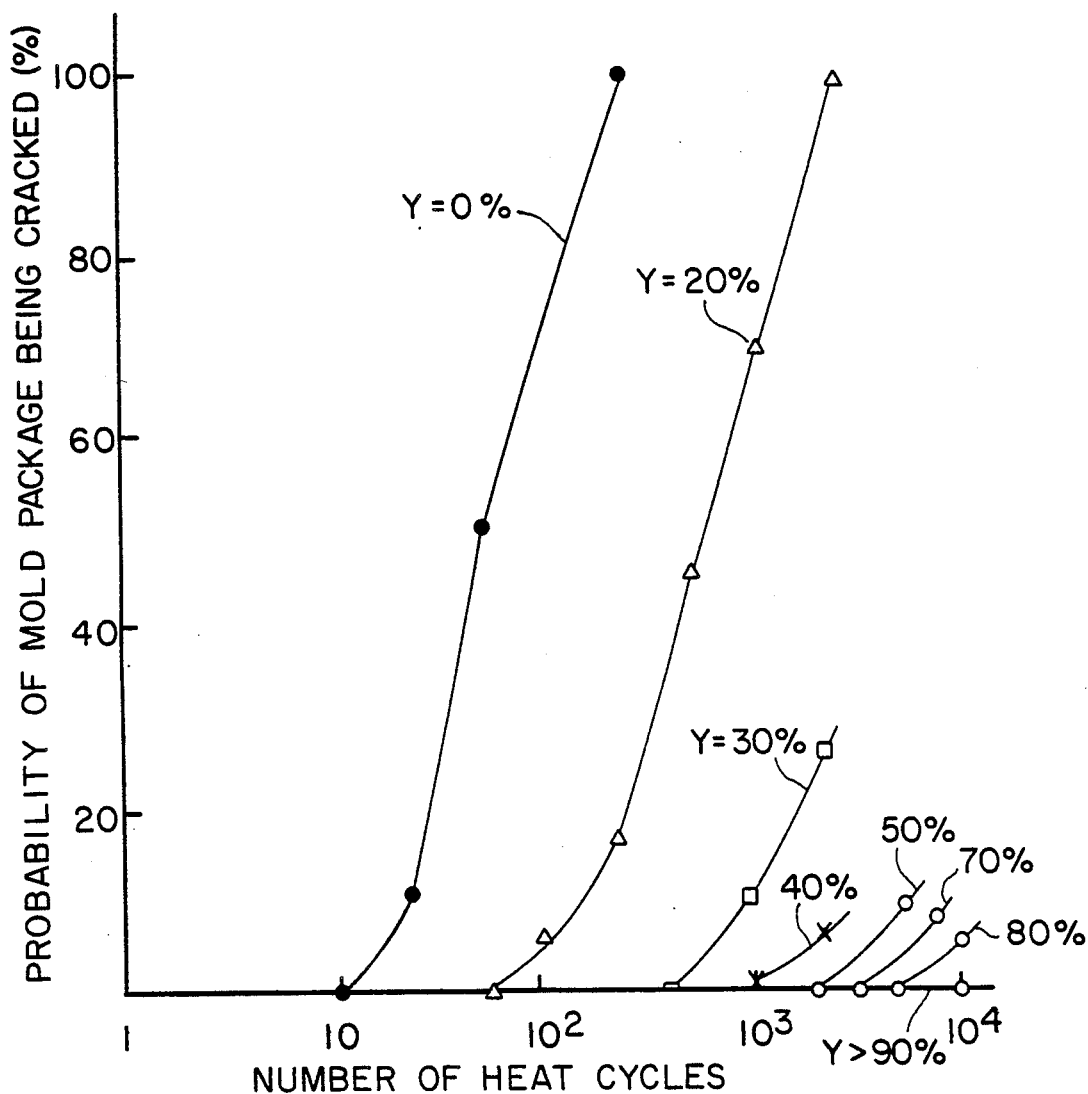
FIG. 5 is a graph illustrating test results for the several embodiments of the present invention, illustrating a relation between a crack occurrence percentage and number of heat cycles.

FIG. 5 shows test results of heat cycles, in which the hybrid integrated circuits provided with an opening 80a in the support plate are subjected to the same heat cycle tests of alternate dipping steps into solutions of $-55°$ C. and 125° C. for five minutes each. As the hybrid integrated circuits for test purposes, a lead frame of copper alloy is used, the circuit substrate has a surface area of $28 \times 28$ mm$^2$ and the occupancy percentage X thereof to the mold package is about 67%.

Herein, an area ratio Y in percent is defined by the following equation:

$$Y = \frac{\text{Opening area of support plate}}{\text{Bottom surface area of circuit substrate}} \times 100(\%).$$

If the outside peripheral shape, in this case a square, of the support plate having the opening is not the same as that of the circuit substrate, the numerator of the above equation is preferably modified to a more precise expression such as "the exposed bottom area of the circuit substrate, directly contacting to mold package." When both outside dimensions of the support plate and substrate circuit are the same or become large, the two definitions are the same or have almost the same area.

The test results are shown in FIG. 5 and the curves show the probability of the mold package cracking versus the number of heat cycles. When area ratio Y is made larger, the curve moves toward the right and lower region in FIG. 5, which means the crack occurrence probability decreases. Each curve of a specific value Y is measured using 50 test pieces. The test result makes clear that crack occurrence can be controlled by providing the opening 80a in the support plate 8.

Especially, when Y is greater than 50%, the mold package can withstand over 1000 heat cycles, and there is no problem in conventional uses. And further, when area ratio Y is made larger than 80%, preferably 90%, the hybrid integrated circuit can be obtained having almost no package crack problems.

In the first embodiment, the opening of a square shape is formed in the support plate, however, the shape is not restricted to the square shape. A rectangular shape is used when the circuit substrate is rectangular. The shape can be changed depending on the design of the circuit substrate.

Figure 6A:
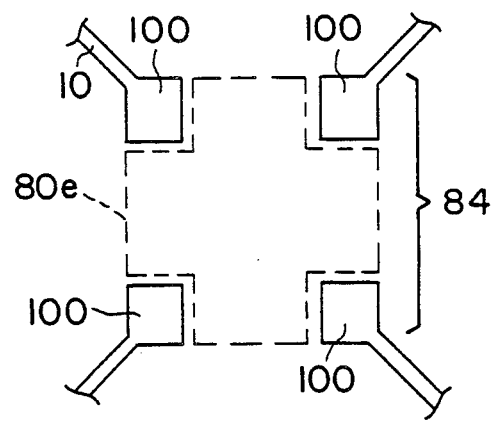

FIG. 6(a) shows a second embodiment of the present invention. The figure shows only a partial plan view of a lead frame omitting outer lead and frame portions thereof, because the remainder of the lead frame is substantially the same as that of FIG. 3. Four square stages 100 form the support plate which are provided at each corner of an assumed square shape having a side length 84. Each stage 100 is supported and connected to the remainder of the lead frame by a single support bar 10 arranged in an outward diagonal direction. Two-dot-dash lines 80e denote schematically the opening of the support plate 8, which is substantially the same as the exposed bottom surface area of the circuit substrate 2. Similar two-dot-dash lines are used in the following figures.

The stages 100 are not to be restricted to the square shape, but may be, e.g., a rectangular or circular shape. Further, the number of stages may be increased depending on the size of the circuit substrate 2.

Figure 6B:
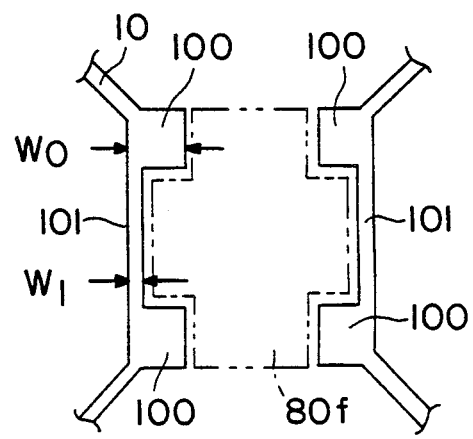
Figure 6C:
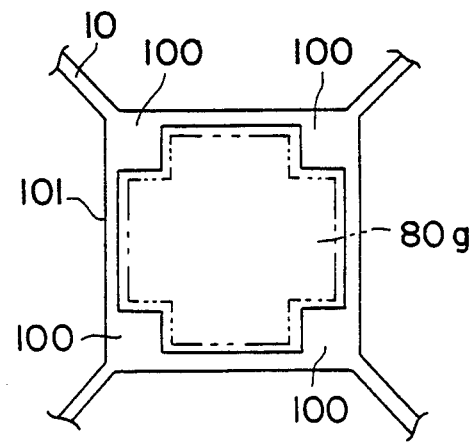

FIGS. 6(b) and 6(c) show third and 4th embodiments of the present invention. In FIG. 6(b), two stages 100 are connected by a connecting bar 101, and in FIG. 6(c), all four stages are connected by four connecting bars 101. Each connecting bar 101 in both figures has a width $W_1$ less than the width $W_0$ of the stage 100. The support plates of these structures are effective to stabilize stage positions mutually when the circuit substrate 2 becomes large.

Figure 6D:
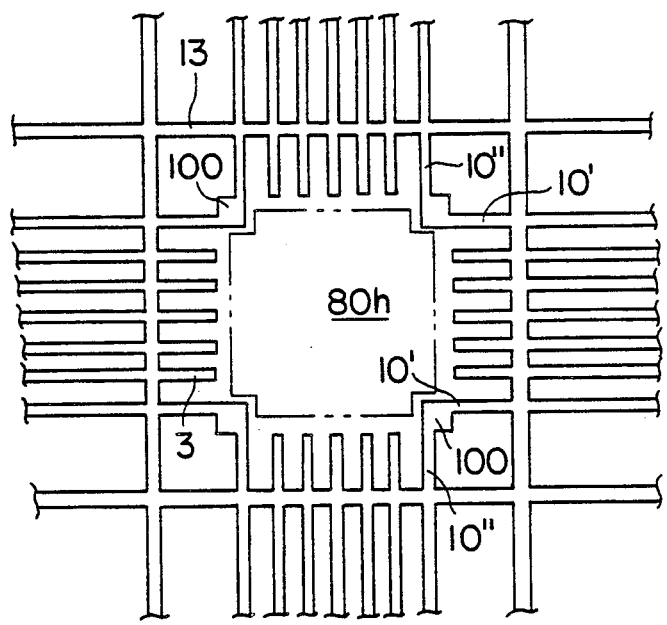
Figure 6E:
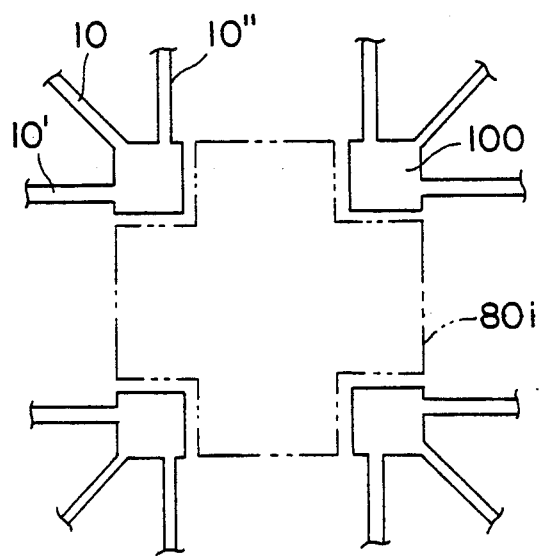

FIGS. 6(d) and 6(e) show a 5th and 6th embodiments of the present invention, which are modifications of FIG. 6(a). In FIG. 6(d), a stage 100 is supported by two support bars 10' and 10". In FIG. 6(e), a stage 100 is supported by three support bars 10, 10' and 10". When the support bar is composed of a single support bar such as shown in FIG. 6(a), the mechanical strength is sometimes insufficient. For example, when the circuit substrate 2 is bonded on stage 100, the stage can deform or encounter a position shift, resulting in inferior quality in wire-bonding or other disadvantages.

On the other hand, the structures shown in FIGS. 6(d) or 6(e) are aimed at increasing the support strength of stages 100 by increasing the number of support bars to two or three.

Table 2 below shows measured displacements of the stage 100 after bonding the circuit substrate 2 thereon using the two types of support bars of FIGS. 6(a) and 6(d). The displacements are measured in each of the X, Y and Z directions. Test pieces for these measurements have a structure such that the stages 100 are located substantially on each corner of a 24×24 mm² square, i.e. the side length 84 of FIG. 6(a) is about 24 mm, and the stage 100 forms a square of about 3×3 mm². The width of support bars 10, 10' and 10" of FIG. 6(d) is about 0.65 mm, the length of support bar 10 of FIG. 6(a) is about 12 mm and the length of the support bars 10', 10" (to an interconnecting bar 13) in FIG. 6(d) is 8.5 mm. The base member forming the circuit substrate has a size of 23×23 mm², is made of alumina ceramic having a 0.5 mm thickness, and is bonded on the stage by heat resistive silicon resin.

Table 2 shows the average data for 50 test pieces for both types measured by a dial gauge and a microscope.

TABLE 2

| Type of support plate | Displacement | | |
| --- | --- | --- | --- |
| | X-direction | Y-direction | Z-direction |
| FIG. 6(a) type | 0.55 mm | 0.35 mm | 0.1 mm |
| FIG. 6(d) type | 0.04 mm | 0.04 mm | 0.05 mm |

As seen in Table 2, the displacement decreases to about one tenth by changing the number of support bars from one to two. In FIG. 6(d), two support bars 10' and 10" are used, in directions thereof forming a right angle and being parallel to a side of the stage.

By increasing the number of support bars to three as shown in FIG. 6(e), further improvement can be expected for molding a larger size of the circuit substrate. In FIG. 6(e), two support bars 10' and 10" form a right angle, each direction being parallel to a side of a square shape, and the remaining support bar 10 is arranged in an outward diagonal direction.

FIGS. 6(f) and 6(f') show a 7th embodiment of the present invention, in which FIG. 6(f) shows a partial plan view of a lead frame and FIG. 6(f') shows a cross section along the line 6(f')—6(f') in FIG. 6(f). The plan view is very similar to that shown in FIG. 6(c), however, as shown in FIG. 6(f'), a stage 100 is displaced to a lower position from a level of an original frame level. On the contrary, the inside end of inner leads 31 is bent upwardly at an upper position in order to bring bonding positions of inner leads and the circuit substrate to the same level even when a thick circuit substrate is utilized. In FIG. 6(f'), a connecting bar 101 has further two sloped portions and a remaining horizontal portion, which contribute to relieve the stress.

Figure 7:
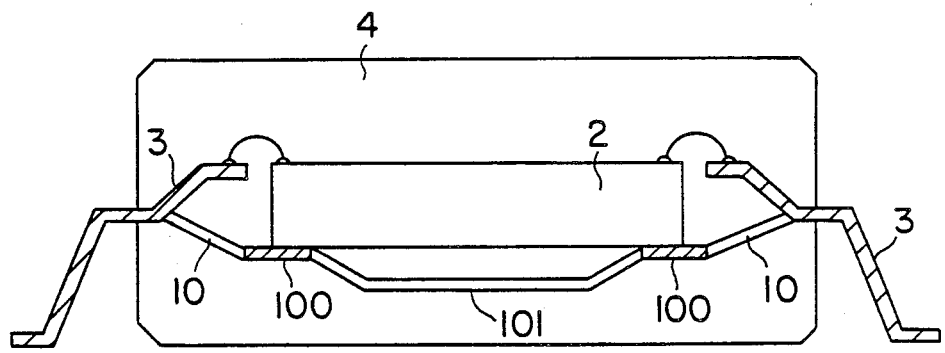
FIG. 7 is a schematic cross section of a device of the present invention with the mold package when the lead frame of FIG. 6(f') is used.

FIG. 7 shows a schematic cross section of a hybrid integrated circuit when the circuit substrate is mounted on this type of lead frame having upwardly deformed inner leads and lowered stages and is molded in a package.

FIGS. 6(g) and 6(g') show an 8th embodiment of the present invention, in which FIG. 6(g) shows a plan view of the support plate and FIG. 6(g') shows a cross section thereof. A connecting bar 101 has an undulation in the same plane of stages 100. The undulation makes the support plate more flexible and has the effect of relieving the stress caused between the circuit substrate 2 and the support plate.

Figure 6H:
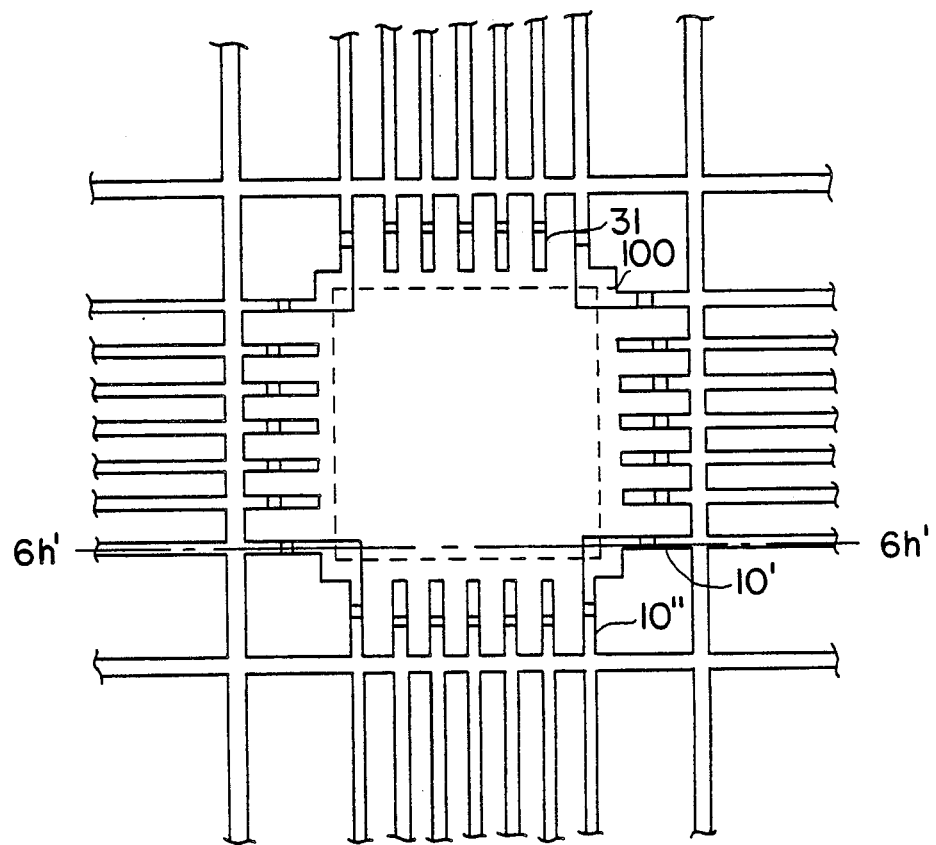
Figure 6H:
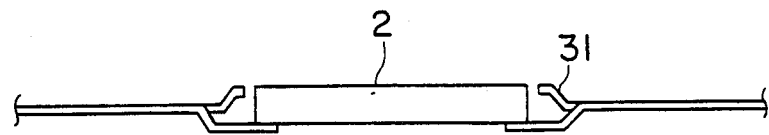

FIGS. 6(h) and 6(h') show a 9th embodiment which is a modification from FIG. 6(d). The top view is quite similar to that of FIG. 6(d). However, as seen from FIG. 6(h'), which is a cross section along line 6(h')—6(h') of FIG. 6(h), a stage 100 is lowered and an inner lead 31 is bent upwardly, resulting in maintaining the inside end of the inner lead 31 at the same level as a surface of the circuit substrate 2.

Figure 6I:
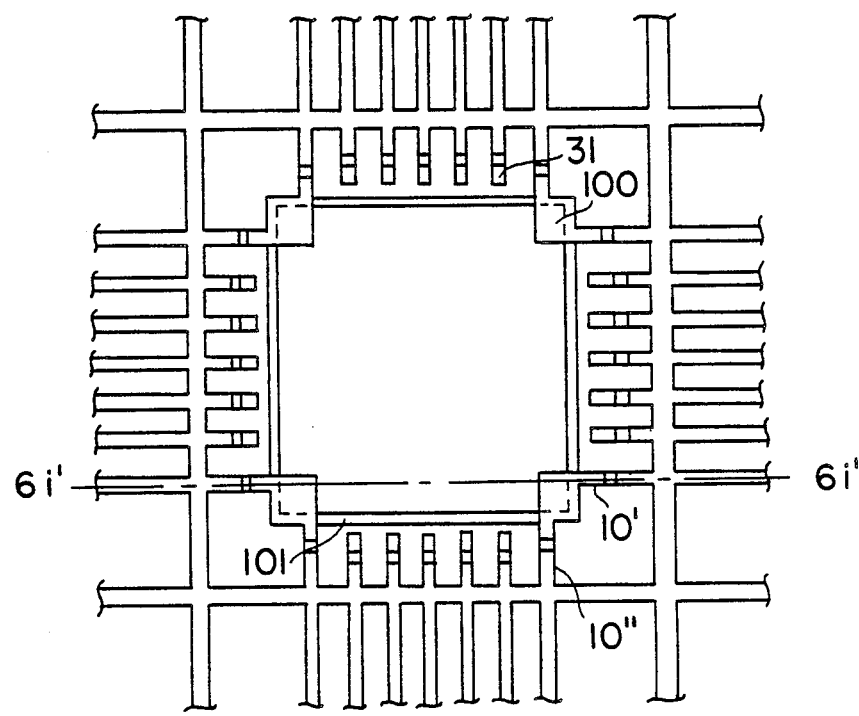
Figure 6I:
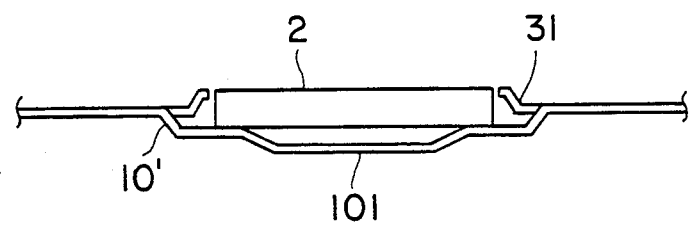

FIGS. 6(i) and 6(i') shows a 10th embodiment which is a modification from FIGS. 6(c) or 6(d). Each stage 100 is mutually connected by a connecting bar 101 and has two support bars 10' and 10''. The stage 100 is lowered and the inside end of a inner lead 3; is bent upwardly as shown in FIG. 6(i') which is similar to that shown in FIGS. 6(f') and 6(h').

Figure 8:
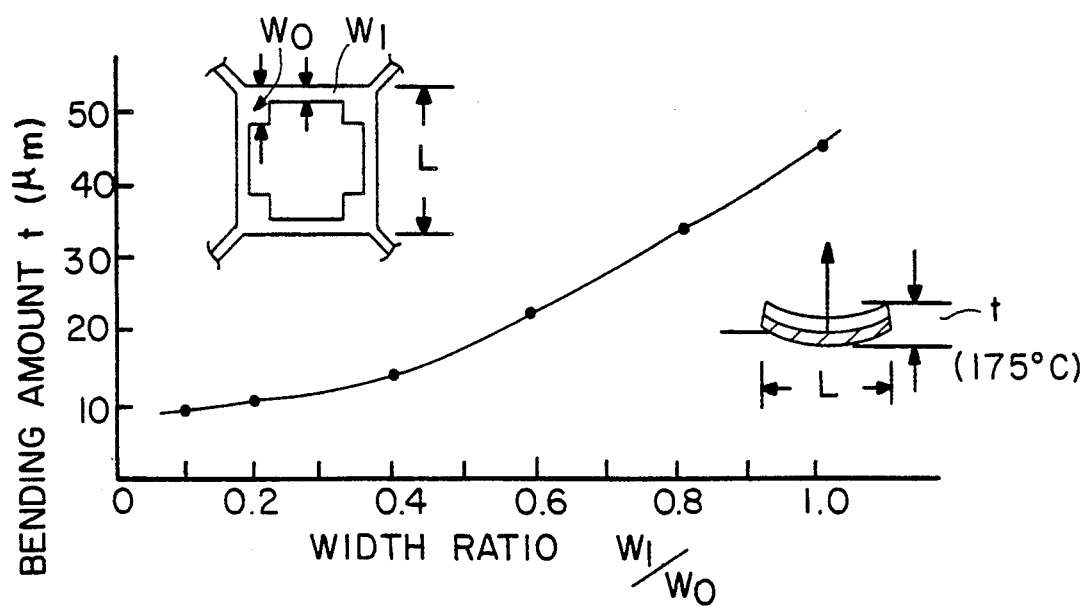
FIG. 8 is a graph illustrating a relation between bending amount and the width of a connecting bar when the lead frame of FIG. 6(c) is utilized.

FIG. 8 is a graph showing a relation between a bending amount t and the width ratio $W_1/W_0$ of a connecting bar to a stage. These notations are illustrated in the inserted figures in FIG. 8. The shape of the lead frame used for the test is the type disclosed by FIG. 6(c). The reference character L denotes a side dimension of a square outline of the support plate, which is chosen as 24 mm in length. The dimension $W_0$ is chosen to be 3 mm. The bending amount t is measured when the assembly of circuit substrate and lead frame is heated to 175° C. which is a molding temperature for the package. FIG. 8 shows that the smaller the width of the connecting bar, the less the bending amount is.

Figure 9:
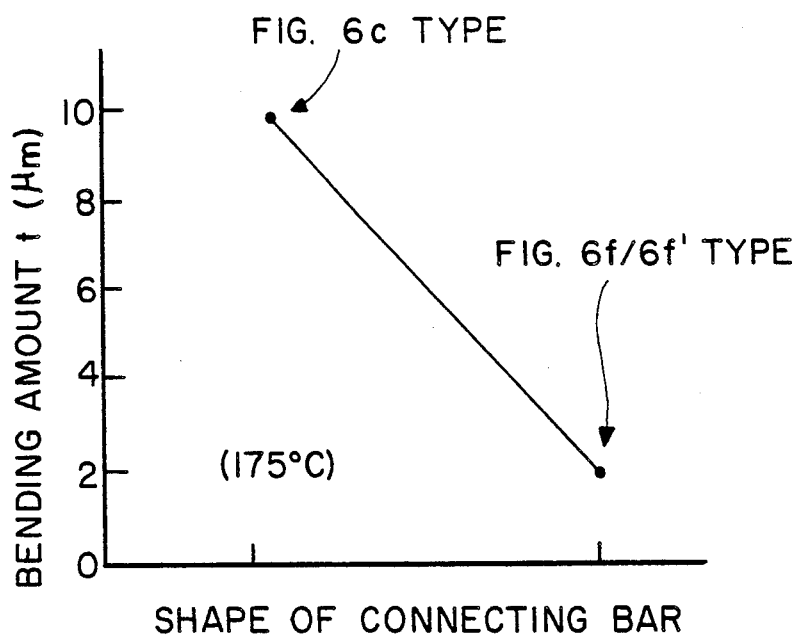
FIG. 9 is a graph illustrating a relation between bending amount and the configuration of a connecting bar when the lead frame of FIGS. 6(c) and 6(f)/6(f') types are utilized.

FIG. 9 is a diagram showing a relation between a bending amount t and the shape for the connecting bar. Similar tests were performed at 175° C. using lead frames having a support plate structure shown in FIG. 6(c) and FIGS. 6(f), 6(f'). The former group has a larger bending amount t than that of the latter group in which the support bar is bent and the stage is lowered.

Figure 10:
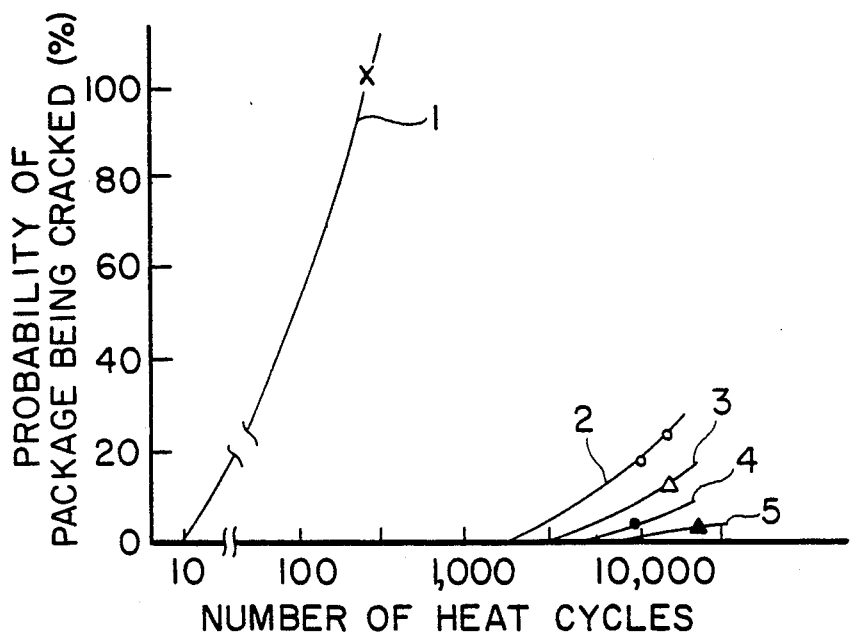
FIG. 10 is a graph illustrating test results of the embodiments illustrating a relation between crack occurrence percentage and number of heat cycles, when the configuration of the support plate is changed.

FIG. 10 is a diagram showing the probability of package cracking versus the number of heat cycles. The tests were performed using test pieces having the area ratio Y of about 60% and the side dimension L of 23 mm in FIG. 8. In FIG. 10, curve 1 is a reproduction of the curve for Y=0% in FIG. 5; curve 2 shows crack probability data for the support plate of FIG. 6(c), where $W_1/W_0$ is given as 0.2; curve 3 shows data for FIG. 6(b); curve 4 shows data for FIG. 6(f) where $W_1/W_0$ is given as 0.2; and curve 5 shows data for both FIG. 6(a) and the one modified from FIG. 6(b) in which the connecting bar has an undulation.

FIG. 10 shows that the crack occurrence probability against heat cycles can be remarkably reduced by providing the opening in the support plate, even when the hybrid integrated circuit has a high occupancy percentage of circuit substrate area to package size.

With today's trend toward higher integration density, a hybrid integrated circuit is desired in which semiconductor active and passive elements, such as a capacitor and resistor, are mounted on both surfaces of the base member 5 forming a circuit substrate 2.

Figure 11A:
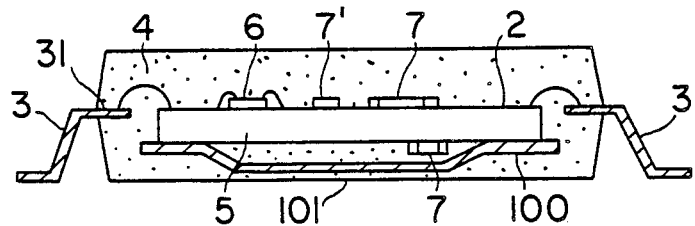
FIGS. 11(a) and 11(b) show a schematic cross section of hybrid devices of the present invention molded in a package using the lead frame of FIGS. 6(f)/6(f') and 6(h)/6(h') types.
Figure 11B:
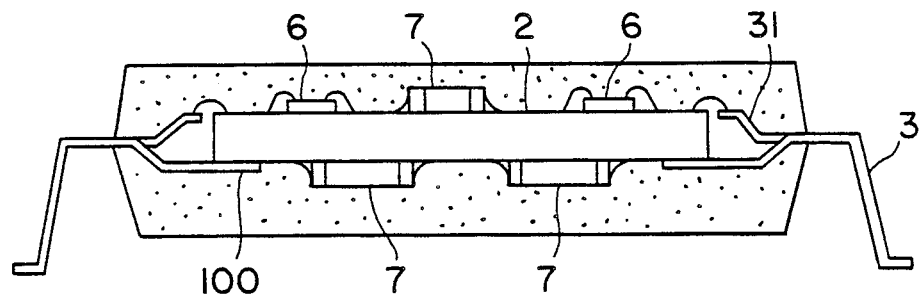

FIG. 11(a) is a schematic cross section of an example of such a hybrid device. A chip capacitor 7 is mounted on both sides of the base member 5 and a semiconductor chip 6 and a resistor 7' are mounted on the upper surface thereof. The assembled circuit substrate 2 is bonded on a stage 100 of support plate and is molded in a package 4. The lead frame used is the type similar as that shown in FIGS. 6(f) and 6(f'), but the inner lead 31 is not bent upwardly FIG. 11(b) shows a cross section of another example of a hybrid device of the present invention. The lead frame as shown in FIG. 6(h) is used in this embodiment. In the figure, two semiconductor integrated circuit chips 6 are mounted on one surface of the circuit substrate 2, and passive chip elements 7 such as resistor, capacitor, etc. are soldered on both surfaces of the circuit substrate 2.

When both surfaces of the base member are utilized for mounting a chip, a lead frame having a support plate without an opening of the prior art can not be used. The hybrid integrated circuit according to the present invention is particularly beneficial when both surfaces are used for mounting chip parts.

Figure 12:
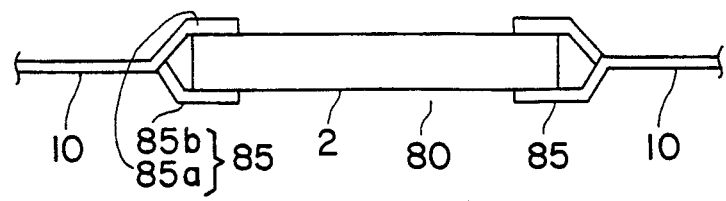
FIG. 12 is a cross section of a clipping structure of the support plate of the present invention, where a circuit substrate is clipped by a pair of clippers.

In order to fix the circuit substrate 2 onto the stage 100 of the lead frame, an adhesive bonding method is generally utilized. However, another method can be used in which the circuit substrate 2 is clipped by a pair of clipper portions of the stage. FIG. 12 shows a schematic cross section of the device in which a tip portion of stage 85 is separated into upper and lower portions 85a and 85b. Portions 85a and 85b clip a fringe of the circuit substrate 2.

As explained with regard to FIGS. 8 and 9, the assembled lead frame and circuit substrate 2 warps downward when heated to 170° C. to 180° C. during the molding process. The bending amount t is relieved by providing the opening in the support plate 8, however, the bend still remains after molding. This state is shown by the cross sectional view of FIG. 13, in which $x_1$ and $x_2$ denote thicknesses of the mold package 4 for upper and lower portions, respectively, with regard to the base member 5, which forms the circuit substrate 2 with chip parts (not shown). In the figures, $x_1$ is represented by a dimension below the support plate 8 which is substantially equal to that below the base member 5. Generally, $x_1$ and $x_2$ are chosen to be almost equal as shown in FIG. 13 and the packaged device shows, as a whole, a downward bend. The states during the transfer molding process are shown schematically and somewhat exaggeratedly in FIGS. 14(a) and 14(b). In FIG. 14(a), the assembled parts are inserted in a molding cavity 20 and heated up to about 175° C., and the circuit substrate 2 and support plate 8 show a downward convex bend. After an injection of epoxy resin material, the mold package is cooled down to room temperature. In this process, the shrinkage forces in the upper and lower portions of the mold package with regard to the circuit substrate 2 are almost equal, therefore, the resin mold hardens without a recovery from the bent shape.

Figure 15A:
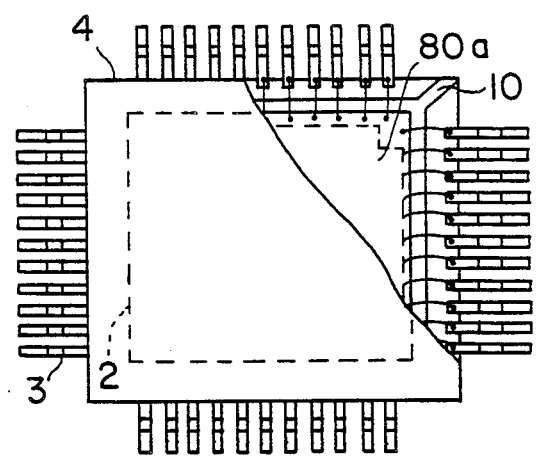
FIGS 15(a) and 15(b) are a top view, partly cut away, and a cross section, respectively, of the device according to the present invention for explaining the device structure, by which deformation of the mold package is eliminated.
Figure 15B:
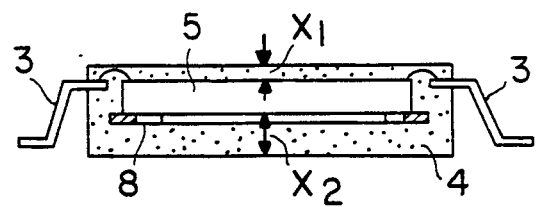

To solve the above problem, another embodiment for improving the package according to the present invention utilizes a package structure which is shown in FIGS. 15(a) and 15(b). FIG. 15(a) is a plan view of the embodiment, with an upper portion of the mold material partially removed, and FIG. 15(b) is a cross section thereof. The parts used therein are similar as those used in the previous embodiments. A circuit substrate 2 has a square size of 23×23 mm$^2$ and a 0.6 mm thickness. In order to detect deformation of the device, a thick film resistor of 10 kiloohms is formed (not shown) on both surfaces of the base member 5 by a printing method, instead of forming the circuit substrate 2 with chip parts. The film resistor is a sensitive passive element for easily detecting deformation of the substrate on which the resistor is formed.

Figure 16A:
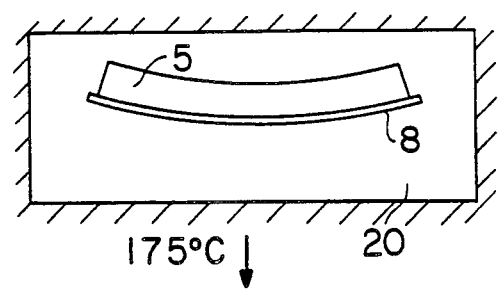
FIGS 16(a) and 16(b) are illustrations similar to FIGS. 14(a) and 14(b), but where the structure of the present invention is applied in order to eliminate deformation.
Figure 16B:
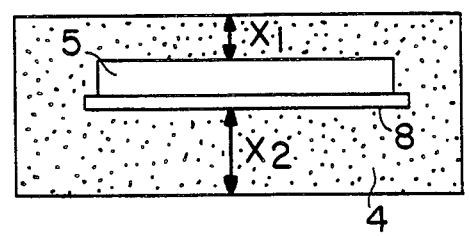

Symbols $x_1$ and $x_2$ denote thicknesses of upper and lower portions of the mold package, respectively. Several kinds of test pieces were fabricated for measuring deformation which depends on a relation between $x_1$ and $x_2$, and the best conditions were sought. The total thickness of $x_1$ and $x_2$ was changed in a range between 3 mm and 5 mm, and a ratio $x_1/x_2$ was changed in a range between 0.3 and 1.5. When the best condition was found, the device shapes in the molding process are shown in FIGS. 16(a) and 16(b), which are the similar figures as FIGS. 14(a) and 14(b). When the assembled parts were heated to about 175° C., a downward convex bend is seen in FIG. 16(a) as in FIG. 14(a). However, when the test piece has a ratio $x_1/x_2$ of the selectively predetermined value in fabrication, in this case $x_1 < x_2$, the packaged device recovers its original flat surface after being cooled down as shown in FIG. 16(b).

Figure 17:
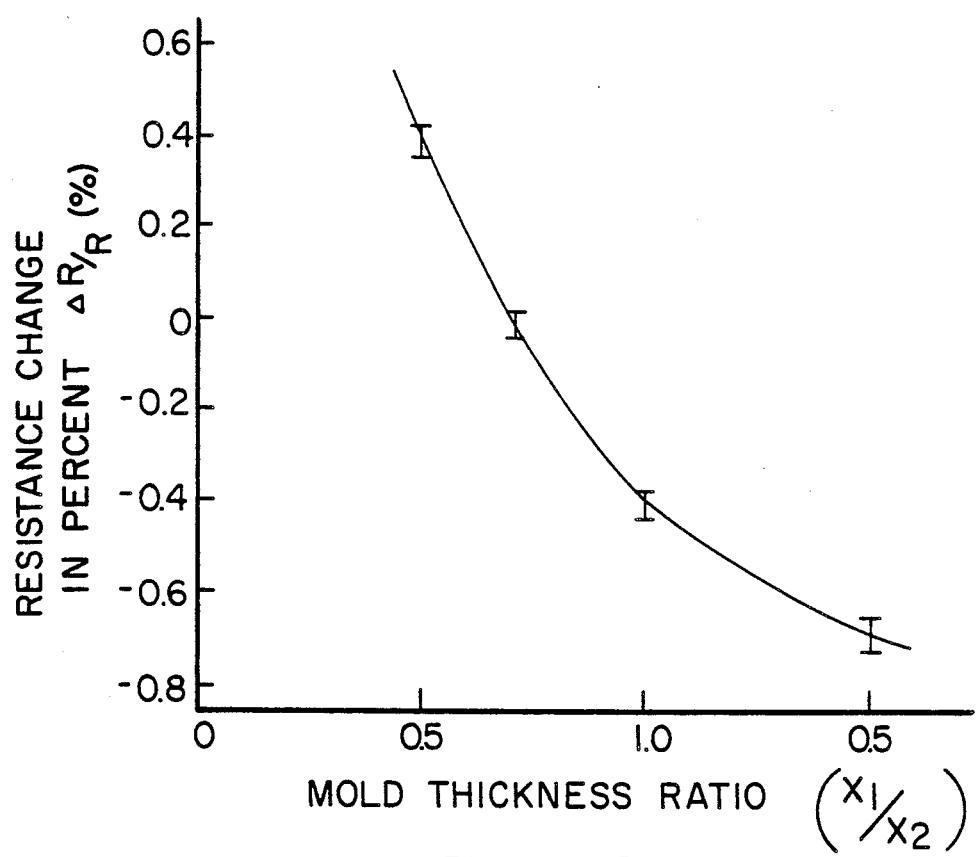
FIGS. 17 and 18 are graphs, each showing a relation between a resistance change for upper and lower resistors, respectively, and a thickness ratio $x_1/x_2$ in order to determine the optimum value of $x_1/x_2$ without deformation, wherein the upper and lower resistors are formed, respectively, on front and bottom surfaces of the circuit substrate, and $x_1$ and $x_2$ denote a thickness of the mold package above and below the circuit substrate, respectively.
Figure 18:
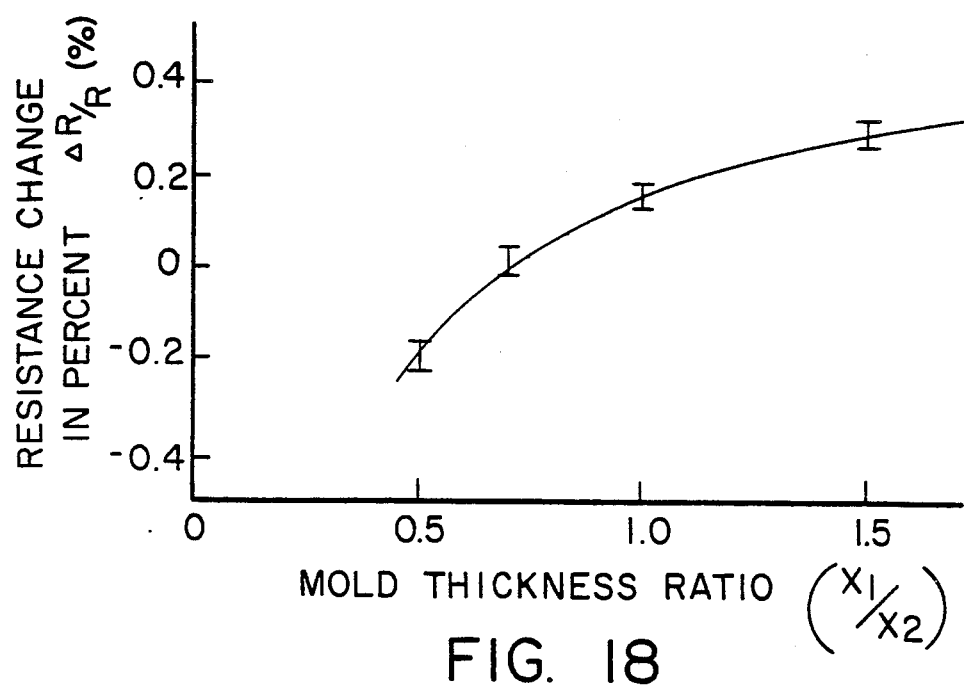

Test results for the mold package having film resistors are shown in FIGS. 17 and 18. The ordinate of both figures shows a resistance change in percent and the abscissa shows a ratio $x_1/x_2$ of upper mold thickness to lower mold thickness. FIG. 17 shows data for the resistors formed on the top surface of the base member 5 and FIG. 18 shows data for those formed on the bottom surface thereof.

Generally, a resistance value of a film resistor increases when the base member 5 on which the film resistor is formed is subjected to an upward convex deformation and, on the contrary, a resistance value decreases when the substrate is subjected to an upward concave deformation.

Test pieces were fabricated utilizing alumina ceramic for the base member 5 having an expansion coefficient of about $7.2 \times 10^{-6}$/°C. and copper alloy for the support plate having an expansion coefficient of about $16.9 \times 10^{-6}$/°C. The expansion of the former was much less than that of the latter, a little less than a half of the latter. As shown in FIGS. 17 and 18, the resistance change was almost nill when $x_1/x_2$ is about 0.7.

If the resistance change within ±0.2% is allowable, the thickness ratio $x_1/x_2$ is preferably selected to be in a range between 0.6 and 0.8.

In the above embodiment, the expansion of the circuit substrate 2 (base member 5) is smaller than that of the support plate 8. Therefore, the upper thickness $x_1$ of the mold package above the base member 5 is selected to be smaller than thickness $x_2$ below the support plate. On the contrary, when the expansion for the base member 5 is larger than that of the support plate 8, for example, when the iron nickel alloy such as so-called "42 alloy" is used therefor, the circuit substrate and the support plate show upward convex deformation when heated. Therefore, the upper thickness $x_1$ of the mold package above the base member is selected to be larger than the thickness $x_2$ under the support plate.

The test piece uses a thick film resistor on the base member as an element which is susceptible to deformation. Other elements such as a capacitor and a semiconductor chip are also apt to change a characteristic due to deformation. Therefore, the present invention of the package structure in which the thickness ratio $x_1/x_2$ is selectively chosen has characteristics of less dispersion and a higher quality.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalence of the claims are, therefore, to be embraced therein.

We claim:

1. A hybrid integrated circuit, comprising:
   (a) a circuit substrate having a bottom surface formed as a base member and at least one semiconductor active element and passive element disposed on the base member;
   (b) a lead frame having a plurality of leads and a support plate, the plurality of leads being arranged outward relative to the support plate, and each of the plurality of leads having an inner lead and an outer lead,
   wherein said circuit substrate is disposed on the support plate and selectively connected to the inner leads;
   (c) a mold of resin material surrounding said circuit including at least one semiconductor active element and passive element and said support plate, and partially surrounding said inner leads to form a mold package including a top and bottom,
   wherein a first ratio of a surface area of said bottom surface of said circuit substrate to a surface area of the bottom of the mold package is greater than 60%; and
   (d) an opening formed in said support plate for exposing a portion of the bottom surface of said circuit substrate to the resin material,
   wherein a second ratio of a portion of the bottom surface area of the circuit substrate that is exposed through the opening to an entire bottom surface area of the circuit substrate is greater than 50%.

2. The circuit as recited in claim 1, wherein said second ratio is greater than 90%.

3. The circuit as recited in claim 1, wherein the material of the base member is an insulating material selected from the group comprising alumina ceramic, epoxy glass, glass coated metal, oxide covered silicon and sapphire.

4. The circuit as recited in claim 1, wherein said lead frame is made of a copper alloy or an iron nickel alloy.

5. The circuit as recited in claim 1, wherein the semiconductor active element is a semiconductor integrated circuit chip.

6. The circuit as recited in claim 1, wherein the support plate comprises four stages arranged at each corner of a rectangular shape, the stages supporting said circuit substrate and the bottom surface area of the circuit substrate being not larger than that of the rectangular shape.

7. The circuit as recited in claim 6, wherein each of said four stages is spaced from each of the other of said four stages and each is connected to a single support bar arranged in an outward diagonal direction relative to a respective corner of the rectangular shape.

8. The circuit as recited in claim 7, wherein the stages form two pair of adjacent stages, each of the stages in a pair being connected by a connecting bar therebetween, the connecting bar having a width less than a width of a stage.

9. The circuit as recited in claim 7, wherein the support plate further comprises four connecting bars, each connecting bar connecting two adjacent stages of the four stages of the support plate with each other and having a width less than a width of a stage.

10. The circuit as recited in claim 6, wherein each stage is connected to two support bars forming a right angle, each support bar being parallel to a side of the rectangular shape.

11. The circuit as recited in claim 6, wherein each stage is connected to three support bars, two support bars thereof forming a right angle, each of the two support bars being parallel to a side of the rectangular shape, and the remaining one support bar being arranged in an outward diagonal direction relative to a respective corner of the rectangular shape.

12. The circuit as recited in claim 9, wherein the four stages are co-planar, each said support bar is bent, and the leads are not in the same plane of the four stages.

13. The circuit as recited in claim 12, wherein each inner lead is bent upward.

14. The circuit as recited in claim 13, wherein each connecting bar has two downwardly sloped portions and a horizontal portion therebetween.

15. The circuit as recited in claim 9, wherein each connecting bar is non-planar.

16. The circuit as recited in claim 1, wherein the at least one semiconductor active element and passive element is disposed on top and bottom surfaces of the base member.

17. The circuit as recited in claim 6, wherein each of said four stages includes upper and lower clipper portions, a fringe of said circuit substrate being clipped therebetween.

18. The circuit as recited in claim 1, wherein a third ratio of a thickness of the resin material above the base member to a thickness of the resin material below the support plate is substantially proportionate to a fourth ratio of an amount of thermal expansion of the base member to an amount of thermal expansion of the support plate.

19. The circuit as recited in claim 1, wherein the base member is made of alumina ceramic, the support plate is made of copper alloy, and a thickness of the resin material above the base member is smaller than a thickness of the resin material below the support plate.

20. The circuit as recited in claim 1, wherein the base member is made of alumina, the support plate is made of nickel-iron "42" alloy, and a thickness of the resin material above the base member is larger than a thickness of the resin material below the support plate.

21. A hybrid integrated circuit, comprising:
(a) a circuit substrate having a bottom surface formed as a base member and at least one semiconductor active element and passive element disposed on the base member;
(b) a lead frame having a plurality of leads and a support plate, the plurality of leads being arranged outward relative to the support plate, and each of the plurality of leads having an inner lead and an outer lead,
wherein said circuit substrate is disposed on the support plate and selectively connected to the inner leads; and
(c) a mold of resin material surrounding said circuit substrate including at least one semiconductor active element and passive element and said support plate, and partially surrounding said inner leads to form a mold package including a top and bottom,
wherein a first ratio of a thickness of the resin material above the base member to a thickness of the resin material below the support plate is substantially proportionate to a second ratio of an amount of thermal expansion of the base member to an amount of thermal expansion of the support plate.

* * * * *

UNITED STATES PATENT AND TRADEMARK OFFICE
CERTIFICATE OF CORRECTION

PATENT NO. : 4,994,895

DATED : February 19, 1991

INVENTOR(S) : Matsuzaki et al.

It is certified that error appears in the above-identified patent and that said Letters Patent is hereby corrected as shown below:

Title page, under "Foreign Patent Documents"

"99360 5/1985" s/b --99360 5/1986--.

Col. 3, line 7, "View" s/b --view--.

Col. 10, line 6, after "upwardly" insert a period;

Col. 10, line 40, "$x_1$" s/b --$x_2$--.

Signed and Sealed this

Twenty-eighth Day of July, 1992

Attest:

DOUGLAS B. COMER

Attesting Officer     Acting Commissioner of Patents and Trademarks